United States Patent
Hartwig et al.

(10) Patent No.: US 10,690,321 B2
(45) Date of Patent: Jun. 23, 2020

(54) OPTICAL ARRANGEMENT AND LAMP

(71) Applicant: OSRAM GmbH, Munich (DE)

(72) Inventors: Ulrich Hartwig, Berlin (DE); Ingo Schmidt, Zeuthen (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 16/413,624

(22) Filed: May 16, 2019

(65) Prior Publication Data

US 2019/0353331 A1 Nov. 21, 2019

(30) Foreign Application Priority Data

May 18, 2018 (DE) .................. 10 2018 207 840

(51) Int. Cl.
*F21V 17/04* (2006.01)
*F21V 5/00* (2018.01)
*F21Y 115/30* (2016.01)
*F21Y 115/15* (2016.01)
*F21Y 115/10* (2016.01)

(52) U.S. Cl.
CPC .............. *F21V 17/04* (2013.01); *F21V 5/007* (2013.01); *F21Y 2115/10* (2016.08); *F21Y 2115/15* (2016.08); *F21Y 2115/30* (2016.08)

(58) Field of Classification Search
CPC ................................ F21V 17/04; F21V 5/007
See application file for complete search history.

(56) References Cited

U.S. PATENT DOCUMENTS

| 5,302,778 A | 4/1994 | Maurinus |
| 2014/0029637 A1 | 1/2014 | Schmidt |

FOREIGN PATENT DOCUMENTS

| DE | 69322821 T2 | 7/1999 |
| DE | 102012213193 A1 | 1/2014 |
| GB | 2391702 A | 2/2004 |

OTHER PUBLICATIONS

German Search Report based on Application No. 10 2018 207 840.8 (8 pages) dated Oct. 23, 2018 (for reference purpose only).

*Primary Examiner* — Thomas M Sember
(74) *Attorney, Agent, or Firm* — Viering, Jentschura & Partner MBB

(57) ABSTRACT

In various embodiments, an optical arrangement is provided. The optical arrangement includes a carrier plate, on which at least one light source is arranged, at least one optical element for directing the radiation of the at least one light source, and at least one sleeve, which is connected to the light source and is intended to hold the optical element. At least one of the sleeve is configured in such a way that the light source and the optical element are respectively arranged therein at least in sections, or the optical element can be positioned exactly with respect to the light source.

9 Claims, 2 Drawing Sheets

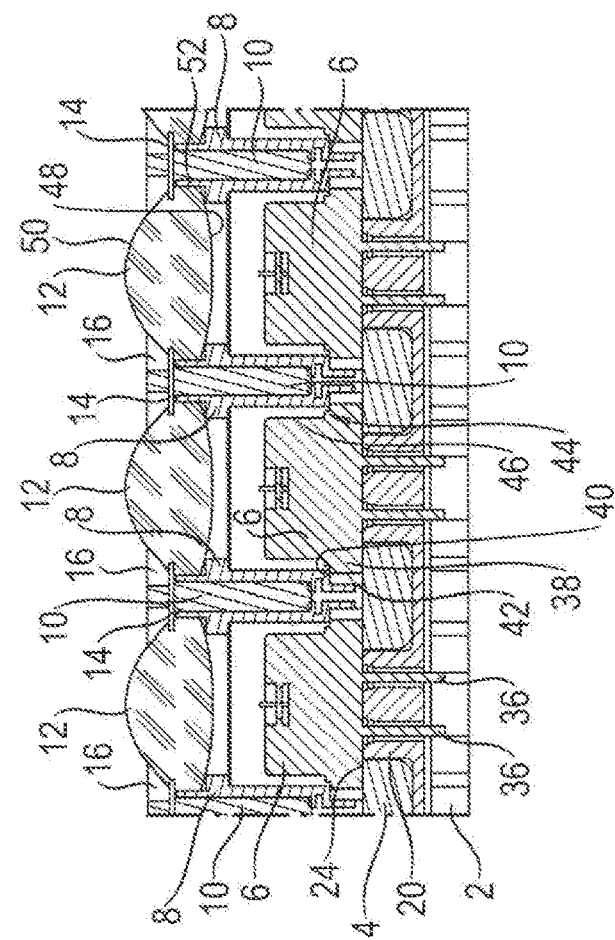
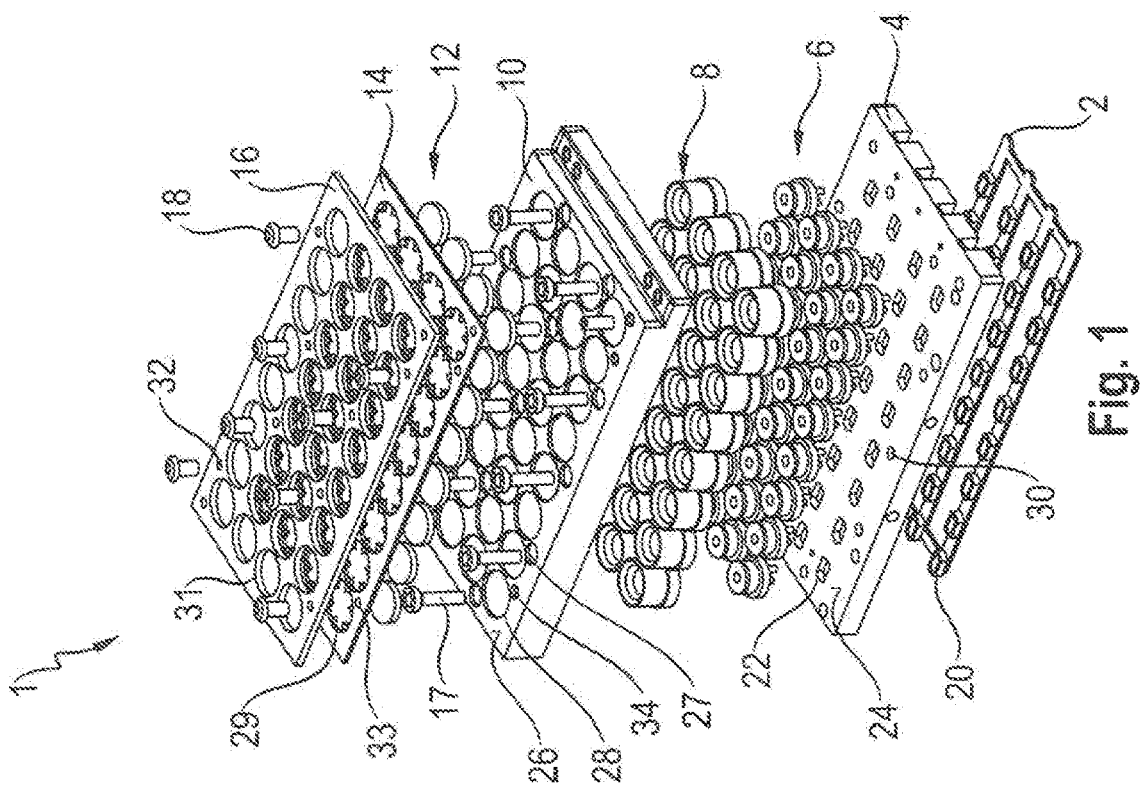

OPTICAL ARRANGEMENT AND LAMP

CROSS-REFERENCE TO RELATED APPLICATION

This application claims priority to German Patent Application Serial No. 10 2018 207 840.8, which was filed May 18, 2018, and is incorporated herein by reference in its entirety.

TECHNICAL FIELD

Various embodiments relate generally to an optical arrangement having at least one light source and to a lamp.

BACKGROUND

Light-emitting diodes (LEDs) arranged in a matrix fashion are known, the LEDs being part of a module. Each individual LED or groups of LEDs in the module may then be separately drivable, and thereby switchable on and off and dimmable, which may also be referred to as pixelated light. Matrix systems configured in such a way comprise optics by which the radiation of the LEDs can be directed.

Document DE 10 2012 213 193 A1 describes an arrangement having a multiplicity of optical semiconductor elements. The semiconductor elements are respectively pressed against a semiconductor element carrier by means of a spring element. An optical element assigned to a respective semiconductor element also bears on the spring element, the spring element being in this case configured in such a way that it defines the distance between the semiconductor element and the optical element.

SUMMARY

In various embodiments, an optical arrangement is provided. The optical arrangement includes a carrier plate, on which at least one light source is arranged, at least one optical element for directing the radiation of the at least one light source, and at least one sleeve, which is connected to the light source and is intended to hold the optical element. At least one of the sleeve is configured in such a way that the light source and the optical element are respectively arranged therein at least in sections, or the optical element can be positioned exactly with respect to the light source.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows an optical arrangement according to an embodiment in an exploded representation;

FIG. 2 shows a cross section through the optical arrangement according to the embodiment in an excerpt.

DESCRIPTION

Figure 3:
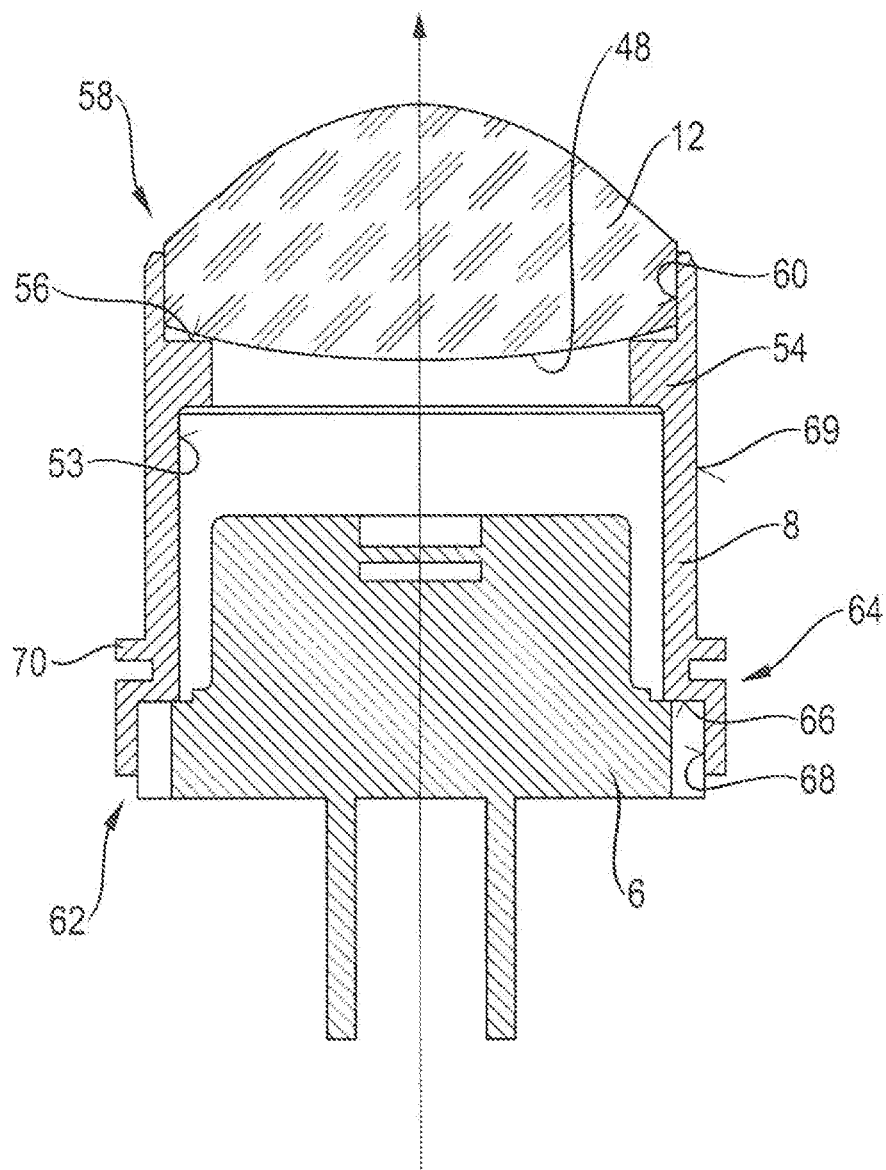
FIG. 3 shows a cross section through a sleeve of the optical arrangement according to the embodiment.

The following detailed description refers to the accompanying drawings that show, by way of illustration, specific details and embodiments in which the invention may be practiced.

Various embodiments provide an optical arrangement which can be produced economically and in a simple way in terms of device technology, as well as a lamp which can be produced economically and simply.

According to various embodiments, an optical arrangement is provided. It may include a e.g. plate-shaped carrier plate, on which at least one light source may be arranged and electrically contacted. An optical element, by which radiation of the light source can be directed, may additionally be provided. Furthermore, a sleeve for holding the optical element may be provided. The sleeve may be held by the light source and/or used to hold the light source. For example, the sleeve is connected to the light source, e.g. with a form fit and/or force fit. In various embodiments, the optical element and the lens are arranged in the sleeve at least in sections, or gripped by the sleeve at least in sections. Furthermore, the optical element can be positioned exactly in relation to the light source by the sleeve.

This solution has the effect that the optical element can be positioned exactly in relation to the light source by the sleeve in a way which is simple in terms of device technology. In other words, a distance of the optical element from the light source is adjusted by the sleeve. Furthermore, the solution has the effect that lateral orientation of the optical element with respect to the light source is adjusted by the sleeve. Since the arrangement primarily includes simply configured components, it can also be produced economically. Furthermore, particularly narrow tolerances are required only on the sleeve, since no other components play a major role in the positioning of the optical element with respect to the light source.

The at least one light source may for example be configured as a semiconductor light source, e.g. as a light-emitting diode (LED). It may be present in the form of at least one individually packaged LED, or in the form of at least one LED chip which includes one or more light-emitting diodes, or in the form of a micro-LED. A plurality of LED chips may be mounted on a common substrate ("submount") and form an LED, or they may be fastened individually or together for example on a circuit board (for example FR4, metal core circuit board, etc.) ("CoB"=Chip on Board). The at least one LED may be equipped with at least one individual and/or shared optics unit for beam guiding, for example with at least one Fresnel lens or a collimator. Instead of or in addition to inorganic LEDs, for example based on AlInGaN or InGaN or AlInGaP, in general it is also possible to use organic LEDs (OLEDs, for example polymer OLEDs). The LED chips may be directly emissive or include an upstream phosphor. As an alternative, the light-emitting component may be a laser diode or a laser diode arrangement. It is also conceivable to provide an OLED light layer or a plurality of OLED light layers or an OLED light region. The emission wavelengths of the light-emitting components may lie in the ultraviolet, visible or infrared spectral range. The light-emitting components may additionally be equipped with their own converter. The LED chips may emit white light in the standardized ECE white area of the automobile industry, for example produced by a blue emitter and a yellow/green converter.

The light source may be a semiconductor laser diode and include an, e.g. approximately, cylindrical or circular-cylindrical housing or diode housing, for example a TO90 or TO56 housing. The diode housing may in this case have an end side, facing away from the carrier plate, into which a housing opening may be introduced. Radiation of the light source may be emitted outward through the housing opening. In various embodiments, standard components, which can be produced economically and in high batch numbers, may be used as a light source.

The diode housing of the light source may furthermore have a bottom side, facing toward the carrier plate, with which it is supported on the carrier plate. On the bottom side, the diode housing may include an outer radial collar or be radially widened, the radial collar having an, e.g. approximately, planar collar surface which faces toward the carrier plate. In various embodiments, the collar surface of the radial collar lies in a plane with the in particular planar bottom side. Orientation of the light source and/or the principal optical axis of the light source in a direction perpendicular to the carrier plate is thereby made possible. A principal emission direction of the light source may thus be configured perpendicularly to the carrier plate.

It is conceivable to provide a multiplicity of light sources which may be arranged, e.g. approximately, for example in a matrix fashion. The light sources may in this case be arranged in a row or in a plurality of rows. A respective light source may then, for example, respectively form a light pixel. It is possible for some of the light sources or each individual light source or groups of light sources to be individually drivable. In this way, individual light sources or groups of light sources may be separately switched on or off or dimmed.

In various embodiments, the optical element is configured as a lens, e.g. as a collimation lens. In this case, the optical element may have a e.g. convex entry surface and a e.g. convex exit surface. A e.g. cylindrical or circular-cylindrical lateral surface may be arranged between the entry surface and the exit surface.

In various embodiments, the sleeve is economically and simply configured as a hollow cylinder, for example as a turned part or machine-turned part, which may enclose the diode housing and/or the optical element at least in sections. The sleeve has, for example, an end side and a bottom side, in which case it may bear with its bottom side on the diode housing, e.g. on the radial collar, in sections, the assigned optical element then being capable of bearing on the end side at least in sections. In the sleeve, an inner lateral surface and an outer lateral surface may be formed between the end side and the bottom side. The sleeve may be arranged approximately coaxially with the radiation direction of the emitted radiation and/or with the principal optical axis of the light source.

The sleeve may have an end-side support surface and an end-side bearing surface. In various embodiments, the optical element may rest on the support surface, e.g. in the axial direction, and bear on the bearing surface e.g. the radial direction. The end-side support surface may be arranged at a distance on the inner circumferential side from the end side of the sleeve. Furthermore, the end-side support surface may face away from the carrier plate. The end-side support surface may e.g. be configured annularly, e.g. circular-annularly, circumferentially, or circumferentially at least in sections, on an inner lateral surface of the sleeve. In various embodiments, the end-side support surface may be configured perpendicularly to the inner lateral surface. A plane in which the end-side support surface is located may thus be arranged at a parallel distance from the carrier plate. In various embodiments, by the sleeve, a precise position of the optical element in an axial direction in relation to the light source and/or the carrier plate may be established by the sleeve.

The end-side bearing surface may advantageously be configured as part of the inner lateral surface of the sleeve and, for example, have a cylindrical or circular-cylindrical shape. In various embodiments, the end-side bearing surface is configured as the part of the inner lateral surface which is arranged between the end-side support surface and the end side of the sleeve. In various embodiments, the optical element may bear, for example with its lateral surface, on the end-side bearing surface, e.g. in the radial direction, as a result of which positioning of the optical element in a plane parallel to the carrier plate is made possible. In other words, the optical element may rest on a shoulder which is formed by the end-side bearing surface and the end-side support surface. The shoulder may, e.g. approximately, be configured at a right angle. In various embodiments, the end-side support surface and the end-side bearing surface and/or the optical element are narrowly toleranced so that the optical element can be fitted in accurately.

The end-side support surface may be formed on a radially circumferential inner collar of the sleeve. The inner collar may be formed on the inner lateral surface of the sleeve, at a distance from the end side of the sleeve. In the axial direction away from the carrier plate, the inner collar may share the inner lateral surface of the sleeve, in which case the end-side bearing surface may be delimited. This may be formed as the part of the inner lateral surface of the sleeve which is arranged between the inner collar and the end side of the sleeve.

If the entry surface of the optical element is for example configured convexly, it is also conceivable for the entry surface to rest on the support surface only with an annular section because of its curvature. In this case, the optical element may for example bear on an edge, which may be formed by the end-side bearing surface and an inner lateral surface of the inner collar. It is, however, also conceivable to frame and retain optical elements having plane or convex or concave entry surfaces in the sleeve. In other words, it is thus also conceivable for the optical element to have a planar holding section, which may rest on the support surface. In another configuration for a convex entry surface, a convex support surface may also be envisioned.

In various embodiments, the sleeve may furthermore include on a bottom side a bottom-side support surface and a bottom-side bearing surface for the light source. The bottom-side support surface may be formed on the inner circumferential side and be arranged at a distance from the bottom side of the sleeve. Furthermore, the bottom-side support surface may face toward the carrier plate. The bottom-side support surface may e.g. be configured annularly, preferably circular-annularly, circumferentially, or circumferentially at least in sections, on an inner lateral surface of the sleeve. In various embodiments, the bottom-side support surface may be configured perpendicularly to the inner lateral surface. A plane in which the support surface is located may thus be arranged at a parallel distance from the carrier plate. In various embodiments, by the bottom-side support surface, a precise position of the light source in an axial direction in relation to the optical element may be established by the sleeve.

In various embodiments, the end-side support surface may in this case be separated further than the bottom-side support surface from the carrier plate. The support surfaces are arranged at a parallel distance from one another.

The bottom-side bearing surface may be formed as part of the inner lateral surface of the sleeve and/or for example cylindrically or circular-cylindrically. In various embodiments, the bottom-side bearing surface is formed as the part of the inner lateral surface which is arranged between the bottom-side support surface and the bottom side of the sleeve. The bottom-side bearing surface may thus, for example, be arranged perpendicularly to the carrier plate. In various embodiments, the light source may bear with its diode housing on the bottom-side bearing surface, e.g. in the radial direction, as a result of which positioning of the light source in a plane which is parallel to the carrier plate is made possible. In other words, the optical element may rest on a shoulder which is formed by the bottom-side bearing surface and the bottom-side support surface. The shoulder may, in particular approximately, be configured at a right angle. In various embodiments, the bottom-side support surface and the bottom-side bearing surface and/or the diode housing are narrowly toleranced so that the diode housing can be fitted in accurately.

In various embodiments, the sleeve may widen radially on the bottom side, i.e. in the direction of the carrier plate. In this way, the bottom-side bearing surface may be delimited from the rest of the inner lateral surface and the bottom-side support surface may be formed.

In various embodiments, the light source may then be supported axially and radially with the radial collar of the diode housing on the bottom-side support surface and the bottom-side bearing surface. In this case, a collar surface, facing away from the carrier plate, of the radial collar may bear on the bottom-side support surface of the sleeve and an outer lateral surface of the radial collar may bear on the bottom-side bearing surface of the sleeve.

By the bottom-side and end-side bearing and support surfaces, the optical element can be positioned exactly both in the axial and in the radial direction relative to the light source. In this way, a desired light pattern, for example a pixel in a matrix-like arrangement, can be made possible. In various embodiments, it becomes possible for the principal emission directions of the light sources to be oriented with high accuracy parallel to one another and perpendicularly to the carrier plate. In this case, "exactly" may mean that, with a beam length of 30 mm, there is a deviation with respect to the vertical of less than, e.g. about, e.g. at most, 0.05 degrees and a deviation from the parallel of less than, e.g. about, 0.04 mm. Vertical may in this case, for example, mean a plane perpendicular to the carrier plate. Parallel may in this case be the parallel region around the principal beam axis.

Furthermore, the sleeve may have an annular outer collar projecting radially outward. This may be arranged in the vicinity or next to the bottom side of the sleeve. In various embodiments, the outer collar may be configured resiliently. The sleeve may be held on the carrier plate by means of the outer collar, which is explained in more detail below.

In various embodiments, a multiplicity of sleeves are provided, which respectively grip a light source and an optical element.

In various embodiments, a housing may be provided for the arrangement. This may grip, and fix on the carrier plate, the at least one sleeve or some of the sleeves or all the sleeves at least in sections. In various embodiments, the housing grips the sleeve in such a way that the sleeve is fixed in a plane parallel to the carrier plate, and movement of the sleeve inside this plane is therefore no longer made possible. In various embodiments, the housing may grip all the sleeves. In this way, the sleeve or some of the sleeves or all the sleeves may be fixed in the axial direction or parallel to the carrier plate.

The housing may be supported on the outer collar of the sleeve or of a respective sleeve, so that the sleeve or the respective sleeve is advantageously held down on the carrier plate. In other words, the housing may be supported by means of the outer collar of the sleeve or of the respective sleeve on the light source and by means of the light source on the carrier plate. A respective sleeve, and the respective light source assigned to the sleeve, are therefore securely fixed and held down on the carrier plate, so that for example optimized heat dissipation can take place from the respective light source to the carrier plate, e.g. without the sleeve touching the carrier plate.

The housing may be configured in the form of a plate. It may include at least one through-opening or a respective through-opening for receiving the sleeve or the respective sleeve, through which the light of a respective light source can emerge. In various embodiments, the housing may have a through-opening for each sleeve. In various embodiments, the sleeve is then arranged between the housing and the carrier plate in such a way that the radiation of the light source can emerge through the through-opening of the housing. The through-openings extend, for example, at a parallel distance from one another. They are, for example, arranged in a matrix fashion. In this way, the emission directions of the respective light sources may be arranged parallel to one another. In other words, the through-openings are formed in a direction perpendicular to the carrier plate.

In various embodiments, the housing is fixed on the carrier plate by at least one fastening means. The at least one fastening means may, for example, be configured as a screw. By means of the fastening means, a pressure may be transmitted by the housing onto the outer collar of the sleeve, so that this sleeve is then pressed onto the light source and onto the carrier plate.

In various embodiments, a clamping plate is provided on a side of the housing facing away from the carrier plate. This clamping plate may be configured in such a way that it can fasten a respective optical element on a respective sleeve or the optical element on the sleeve. In this case, the clamping plate may have a through-opening or a respective through-opening, through which the optical element or a respective optical element can project, or they can respectively project. Advantageously, the optical element may be held by the clamping plate in the sleeve in the axial direction, so that a holding force is applied to it particularly in the direction of the carrier plate. In this case, the clamping plate may apply a force to the optical element in the axial direction and in the direction of the end-side support surface of the sleeve. For example, the optical element may be supported with an exit surface on the clamping plate and with an entry surface on the end-side support surface of the sleeve, so that the optical element is fixed in the sleeve.

Furthermore, a holding plate may be provided, which may be arranged on the side of the clamping plate facing away from the carrier plate, and by which the clamping plate can be fixed on the housing. To this end, at least one fastening means may be provided, by which the holding plate can fix the clamping plate on the housing. The fastening means may, for example, be configured as a screw or bolt. The at least one fastening means may in this case, for example, pass through a through-opening respectively in the holding plate and in the clamping plate, and be fixed in a bore on the housing.

In various embodiments, the housing and/or the carrier plate may be produced by the diecasting method. In this way, high batch numbers may be produced economically and in a way which is simple in terms of device technology.

In various embodiments, a heat sink is provided in the case of the carrier plate, or in the carrier plate, in such a way that the heat sink can be in thermal contact with the light source/s. In this way, waste heat of the light source can be dissipated through the heat sink in order to protect the light source from overheating. If the light source is configured as an LED or semiconductor laser diode, an optical power of the arrangement may furthermore be increased, since LEDs or semiconductor laser diodes can be operated optimally in a particular temperature range.

When mounting the optical arrangement, for example, the at least one light source or a plurality of light sources may then be mounted and contacted on the carrier plate. Subsequently, the sleeve or a respective sleeve may be mounted on the, or on the respective, light source, in such a way that the sleeve grips the light source on the bottom side at least in sections. In a next step, the housing may for example be fixed on the carrier plate with the at least one fastening means. The housing may be arranged in such a way that the respective light source can emit its radiation through a corresponding through-opening in the housing. Subsequently, the at least one optical element or a respective optical element may be introduced into the, or into the respective, sleeve from a side facing away from the carrier plate, e.g. in such a way that the element projects from the through-opening of the housing. Subsequently, the clamping plate, which can fix the at least one optical element or a respective optical element in the, or in the respective, sleeve, may be applied on the housing from the side of the housing facing away from the carrier plate. In a further partial process, the holding plate may be arranged, from the side of the clamping plate facing away from the carrier plate, on this clamping plate, in which case the at least one fastening means which fixes the holding plate and the clamping plate on the housing may be provided. A different order of the mounting partial processes may likewise be envisioned.

According to various embodiments, a lamp having the optical arrangement according to one of the aspects above is furthermore provided. The lamp is preferably used in a vehicle.

The vehicle may be an aircraft or a water-bound vehicle or a land-bound vehicle. The land-bound vehicle may be a motor vehicle or a rail vehicle or a bicycle. In various embodiments, the vehicle is a truck or a passenger car or a motorcycle. The vehicle may furthermore be configured as a nonautonomous or semiautonomous or autonomous vehicle. If the lamp is used for a vehicle, it may be a headlamp.

Further fields of application for the lamp may be effective lighting, entertainment lighting, architainment lighting, general lighting, medical and therapeutic lighting or lighting for gardening (horticulture).

An exemplary field of application is a laser-based light source for a head-moved lamp, also referred to as a moving head. In various embodiments, the head-moved lamp includes a plurality of optical arrangements according to various embodiments, each of the optical arrangements being fitted with laser diodes respectively in different light colors (for example red, green, blue) and beam superposition to generate mixed light, including white light, taking place in the head-moved lamp by means of suitable optical elements, for example dichroic mirrors.

According to FIG. 1, the optical arrangement 1 has a contact element 2 for electrical contacting, a carrier plate 4, a multiplicity of semiconductor laser diodes 6 or laser diodes or lasers as a light source, a multiplicity of sleeves 8 for a respective semiconductor laser diode 6, a housing 10, a multiplicity of optical elements 12, a clamping plate 14, a holding plate 16 and various fastening means 17 and 18, the fastening means 17, 18 respectively being provided with a reference only at one position for the sake of simplicity.

The contact element 2 includes a matrix-like arrangement of electrical contacts 20, for the sake of simplicity provided with a reference only at one position, by which the semiconductor laser diodes 6 can be electrically contacted. In the embodiment shown, a matrix-like arrangement of 4×8 semiconductor laser diodes 6 is provided. Other embodiments may likewise be envisioned. The contact element 2 is arranged on a side of the carrier plate 4 facing away from the semiconductor laser diodes 6.

The carrier plate 4 is configured in such a way that it grips the contact element 2 on a side facing away from the semiconductor laser diodes 6. It has through-openings 22, for the sake of simplicity provided with a reference only at one position, a respective semiconductor laser diode 6 being contactable by the contact element 2 through a respective through-opening 22.

On the side facing away from the contact element 2, the carrier plate 4 has a planar surface 24 on which the semiconductor laser diodes 6 rest.

The semiconductor laser diodes 6 are explained in more detail below, particularly in FIG. 2 and FIG. 3, and the sleeves 8 particularly in FIG. 3.

The housing 10 grips the sleeves 8, a respective sleeve 8 being provided for each semiconductor laser diode 6. It has a planar end surface 26, which faces away from the carrier plate 4. Through-openings 28, for the sake of simplicity provided with a reference only at one position, are provided in the housing 10, a respective sleeve 8 being provided in a respective through-opening 22. Light of a respective semiconductor laser diode 6 then shines through a respective through-opening 28. The housing 10 is fastened on the carrier plate 4 by means of fastening means 17. The fastening means 17 are, for example, configured as screws or bolts. They pass through holes 27 provided for this purpose, for the sake of simplicity provided with a reference only at one position, on the housing 10 and open into bores 30, provided for this purpose, of the carrier plate 4, which for the sake of simplicity are provided with a reference only at one position.

The optical elements 12 are introduced from a side of the housing 10 facing away from the carrier plate 4, through the through-openings 28 of the housing 10, into the sleeves 8. The optical elements 12 will be explained in more detail below in FIG. 2.

The clamping plate 14 is arranged over the side of the housing 10 facing away from the carrier plate 4, in such a way that a respective optical element 12 is held in a respective sleeve 8 by it. To this end, the clamping plate 14 includes through-openings 29 (provided with a reference only at one position), which are configured in such a way that they respectively fix an optical element 12 in the respective sleeve 8. The through-openings 29 may, for example, include radially inner-lying lugs and/or clamping projections, which are engaged with a force fit with the optical element 12. The clamping projections may, for example, be resilient. By means of holes 33, which are provided with a reference only at one position, the clamping plate 14 is fixed on the housing 10.

Lastly, the holding plate 16 is arranged on a side of the clamping plate 14 facing away from the carrier plate 4.

The fastening means 18 pass through the holes 32, provided for this purpose, of the holding plate 16 and the holes 33 of the clamping plate 14, and open into bores 34, provided for this purpose, of the housing 10. The holding plate 16 and the clamping plate 14 are therefore fastened on the housing 10. The holding plate 16 includes through-openings 31 (provided with a reference only at one position), through which respectively a respective optical element 12 projects.

In each case, a through-opening 28 of the housing 10 and a through-opening 29 of the clamping plate 14 and a through-opening 31 of the holding plate 16 are arranged adjacent in such a way that a respective optical element 12 projects through them. For example, they are arranged coaxially with one another.

According to FIG. 2, the contact element 2 is arranged on a side of the carrier plate 4 facing away from the semiconductor laser diodes 6. By means of respectively two contacts 36, provided with references by way of example only on one semiconductor laser diode 6, the semiconductor laser diodes 6 are contacted by the electrical contacts 20 of the contact element 2.

A respective semiconductor laser diode 6 in FIG. 2 is arranged on the surface 24 of the carrier plate 4 and is gripped by the respective sleeve 8. The respective sleeve 8 will be explained in more detail in FIG. 3.

A respective semiconductor laser diode 6 is configured according to FIG. 2 to be packaged and arranged in such a way that the optical arrangement is arranged perpendicularly to the carrier plate 4. On a side facing the carrier plate 4, a respective semiconductor laser diode 6 includes an end-side radial collar 38, provided with a reference by way of example only on one semiconductor laser diode 6, which grips the semiconductor laser diode 6 at least in sections. The radial collar 38 includes, on its side facing away from the carrier plate 4, an annular support surface 40 on which a respective sleeve 8 rests, axially as seen in the radiation direction of the semiconductor laser diodes 6. The cylindrical lateral surface of the radial collar 38 is configured as a bearing surface 42, on which the respective sleeve 8 rests, radially as seen in the direction of the principal optical axis of the semiconductor laser diodes 6.

In the direction away from the carrier plate 4, the support surface 40 of the respective semiconductor laser diode 6 is followed by a shoulder section 44, which is followed by a section 46 with a smaller diameter than the radial collar 38. The shoulder section 44 is configured in such a way that the respective semiconductor laser diode 6 is fixed in the radial direction by the sleeve 8.

According to FIG. 2, a respective optical element 12 is configured as a lens, for example as a collimation lens. It respectively includes a convex entry surface 48 and a convex exit surface 50, provided with a reference by way of example only on one optical element 12. A lateral surface 52 is provided between the entry surface 48 and the exit surface 50.

The sleeve 8 is followed, in the direction away from the carrier plate 4, first by the clamping plate 14 and then by the holding plate 16. In this case, a respective optical element 12 projects with the exit surface 50 out from the clamping plate 14 and the holding plate 16.

According to FIG. 3, one of the sleeves 8 with the semiconductor laser diode 6 and the optical element 12 is represented. The sleeve 8 is configured approximately hollow-cylindrically. It includes an internally circumferential inner collar 54 on an inner lateral surface 53. This collar has a support surface 56 facing away from the carrier plate 4 of FIG. 1, on which the optical element 12 is supported in the axial direction with its entry surface 48, see FIG. 2. The inner collar 54 is arranged at a distance from an end side 58 of the sleeve 8. Between the end side 58 and the inner collar 54, a section of the inner lateral surface 53 is configured as a bearing surface 60, on which the optical element 12 is supported in the radial direction with its lateral surface 52, see FIG. 2. The section of the inner lateral surface 53 with the bearing surface 60 has a smaller wall thickness than the remaining part of the sleeve 8. On a bottom side 62, the sleeve 8 is radially widened. This creates a shoulder section 64, which forms an inner axial annular support surface 66 facing toward the semiconductor laser diode 6 and a bearing surface 68 facing radially inward. The semiconductor laser diode 6 can rest on the support surface 66 in the axial direction, as already explained above with reference to FIG. 2, and on the bearing surface 68 in the radial direction. Adjacent to the shoulder section 64, on its side facing away from the carrier plate 4, on the outside of an outer lateral surface 69 of the sleeve 8, an outer collar 70 is formed on which the housing 10, see FIG. 2, is supported so as to press the sleeve against the semiconductor laser diode 6 and the carrier plate 4, see FIG. 2. In various embodiments, the pressing includes elastic or even plastic bending of the outer collar 70. In various embodiments, a gap in this case remains between the sleeve 8 and the surface of the carrier plate 4, so that in the case of a multiplicity of sleeves 8 each individual sleeve 8 is pressed with an approximately equal pressing force against the carrier plate 4, which is important for efficient and homogeneous dissipation of the heat from the laser diodes 6 by means of the carrier plate 4.

Disclosed is an optical arrangement having a carrier plate, on which at least one light source is arranged, having at least one optical element for directing the radiation of the at least one light source, having at least one sleeve for holding the light source and the optical element, wherein the sleeve is configured in such a way that the light source and the optical element are arranged therein at least in sections, and/or in that the optical element can be positioned exactly with respect to the light source.

| | |
|---|---|
| optical arrangement | 1 |
| contact element | 2 |
| carrier plate | 4 |
| semiconductor laser diode | 6 |
| sleeve | 8 |
| housing | 10 |
| optical element | 12 |
| clamping plate | 14 |
| holding plate | 16 |
| fastening means | 17, 18 |
| electrical contact | 20 |
| through-opening | 22 |
| surface | 24 |
| end surface | 26 |
| hole | 27 |
| through-opening | 28 |
| through-opening | 29 |
| bore | 30 |
| through-opening | 31 |
| hole | 32 |
| hole | 33 |
| bore | 34 |
| electrical contact | 36 |
| radial collar | 38 |
| support surface | 40 |
| bearing surface | 42 |
| shoulder section | 44 |
| section | 46 |
| entry surface | 48 |
| exit surface | 50 |
| lateral surface | 52 |
| inner lateral surface | 53 |
| inner collar | 54 |
| support surface | 56 |
| end side | 58 |
| bearing surface | 60 |
| bottom side | 62 |
| shoulder section | 64 |
| support surface | 66 |
| bearing surface | 68 |
| outer lateral surface | 69 |
| outer collar | 70 |

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An optical arrangement, comprising:
a carrier plate, on which at least one light source is arranged;
at least one optical element for directing radiation from the at least one light source;
at least one sleeve, which is connected to the light source and is intended to hold the optical element; wherein the at least one sleeve comprises, on an end side, a shoulder with a support surface and with a bearing surface, on which surfaces the optical element bears; wherein the at least one sleeve is widened radially with an increased diameter on the end side, facing toward the carrier plate, as a result of which the bearing surface and the support surface for the light source are formed;
wherein at least one of the at least one sleeve is configured in such a way that the light source and the optical element are respectively arranged therein at least in sections, or the optical element can be positioned exactly with respect to the light source.

2. The optical arrangement of claim 1,
wherein the sleeve comprises on a carrier plate side a shoulder with a support surface and with a bearing surface, on which surfaces the light source bears.

3. The optical arrangement of claim 1,
wherein an inner collar, extending around at least in sections in a circumferential direction of the sleeve, which comprises an end-side support surface for the optical element and delimits an end-side bearing surface, is provided on an inner lateral surface of the sleeve.

4. The optical arrangement of claim 1,
wherein a plate-shaped housing is provided, which grips and positions the at least one sleeve or some of the sleeves or all the sleeves at least in sections.

5. The optical arrangement of claim 4,
wherein the sleeve comprises on an outer lateral surface an outer collar, extending around at least in sections, which is in contact with the housing and by means of which the sleeve is held on the carrier plate.

6. The optical arrangement of claim 4,
wherein a clamping plate fastened on the housing is provided in such a way that the at least one optical element or some of the optical elements or all the optical elements is/are fixed in the sleeve or a respective sleeve by it.

7. The optical arrangement of claim 6,
wherein a holding plate is provided in such a way that the clamping plate can be fixed on the housing by it.

8. The optical arrangement of claim 1,
wherein a multiplicity of light sources are provided, which are arranged in a matrix fashion on the carrier plate.

9. A lamp, comprising:
an optical arrangement, comprising:
a carrier plate, on which at least one light source is arranged;
at least one optical element for directing a radiation of the at least one light source;
at least one sleeve, which is connected to the light source and is intended to hold the optical element; wherein the at least one sleeve comprises, on an end side, a shoulder with a support surface and with a bearing surface, on which surfaces the optical element bears; wherein the at least one sleeve is widened radially with an increased diameter on the end side, facing toward the carrier plate, as a result of which the bearing surface and the support surface for the light source are formed;
wherein at least one of the at least one sleeve is configured in such a way that the light source and the optical element are respectively arranged therein at least in sections, or the optical element can be positioned exactly with respect to the light source.

* * * * *